(12) United States Patent
Ota et al.

(10) Patent No.: US 9,187,260 B2
(45) Date of Patent: Nov. 17, 2015

(54) CONVEYING SYSTEM AND CONVEYING METHOD

(75) Inventors: Tatsuji Ota, Inuyama (JP); Masazumi Fukushima, Inuyama (JP); Yasuhisa Ito, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 71 days.

(21) Appl. No.: 13/877,889

(22) PCT Filed: Oct. 28, 2011

(86) PCT No.: PCT/JP2011/074923
§ 371 (c)(1),
(2), (4) Date: Apr. 4, 2013

(87) PCT Pub. No.: WO2012/060291
PCT Pub. Date: May 10, 2012

(65) Prior Publication Data
US 2013/0199892 A1      Aug. 8, 2013

(30) Foreign Application Priority Data

Nov. 4, 2010   (JP) ................. 2010-247554

(51) Int. Cl.
    *B65G 47/00*    (2006.01)
    *B65G 37/02*    (2006.01)
    *H01L 21/677*   (2006.01)

(52) U.S. Cl.
    CPC ............... *B65G 47/00* (2013.01); *B65G 37/02* (2013.01); *H01L 21/67733* (2013.01); *H01L 21/67736* (2013.01); *H01L 21/67769* (2013.01); *B65G 2201/0297* (2013.01)

(58) Field of Classification Search
None
See application file for complete search history.

(56) References Cited

U.S. PATENT DOCUMENTS

| 4,049,132 A | 9/1977 | Stromback |
| 5,395,199 A | 3/1995 | Day, III et al. |
| 6,183,184 B1 | 2/2001 | Shiwaku |
| 6,468,021 B1 * | 10/2002 | Bonora et al. ................ 414/522 |
| 6,889,813 B1 | 5/2005 | Trammell et al. |
| 7,261,510 B2 * | 8/2007 | Motoori et al. ............... 414/281 |
| 7,413,396 B2 | 8/2008 | Ito |
| 7,991,505 B2 | 8/2011 | Lert, Jr. et al. |

(Continued)

FOREIGN PATENT DOCUMENTS

| EP | 1707507 A1 | 10/2006 |
| EP | 1944251 A1 | 7/2008 |

(Continued)

OTHER PUBLICATIONS

U.S. office action dated Jul. 10, 2014 issued in related U.S. Appl. No. 13/283,628.

*Primary Examiner* — Kavel Singh
(74) *Attorney, Agent, or Firm* — DLA Piper LLP (US)

(57) ABSTRACT

A system for transporting an article between a plurality of processing devices includes a track extending above load ports of the processing devices, and an overhead travelling vehicle that travels along the track and has a hoist. A local track disposed lower than the track extends at least to a position under the track, and is oriented perpendicular to the track when viewed from above. A local carriage travels along the local track and has a hoist for vertically moving the article. A buffer disposed below the local track delivers and receives the article to and from the local carriage, and extends at least to a position under the track.

11 Claims, 7 Drawing Sheets

(56) References Cited

U.S. PATENT DOCUMENTS

| | | |
|---|---|---|
| 8,047,762 B2 | 11/2011 | Zimmerhackl et al. |
| 2004/0109746 A1 | 6/2004 | Suzuki ............ 414/373 |
| 2006/0051192 A1 | 3/2006 | Fujiki |
| 2006/0182553 A1 | 8/2006 | Yamamoto et al. |
| 2008/0014061 A1 | 1/2008 | Izumi |
| 2008/0221728 A1 | 9/2008 | Inui |
| 2009/0238664 A1* | 9/2009 | Murata et al. ............ 414/222.02 |
| 2010/0003111 A1 | 1/2010 | Yeo et al. |
| 2010/0239400 A1 | 9/2010 | Ishikawa |
| 2012/0114453 A1 | 5/2012 | Ota et al. |
| 2012/0263562 A1 | 10/2012 | Mizokawa et al. |
| 2012/0275886 A1 | 11/2012 | Ota |

FOREIGN PATENT DOCUMENTS

| | | |
|---|---|---|
| JP | 2004-189018 | 7/2004 |
| JP | 2005-150129 | 6/2005 |
| JP | 2006224944 A | 8/2006 |
| JP | 2008100835 A | 5/2008 |
| JP | 2009-126668 | 6/2009 |
| JP | 2010016387 A | 1/2010 |
| JP | 2010064833 A | 3/2010 |
| JP | 2011207621 A | 10/2011 |
| WO | 0037338 A1 | 6/2000 |
| WO | 2011111283 A1 | 9/2011 |

\* cited by examiner

F I G. 2
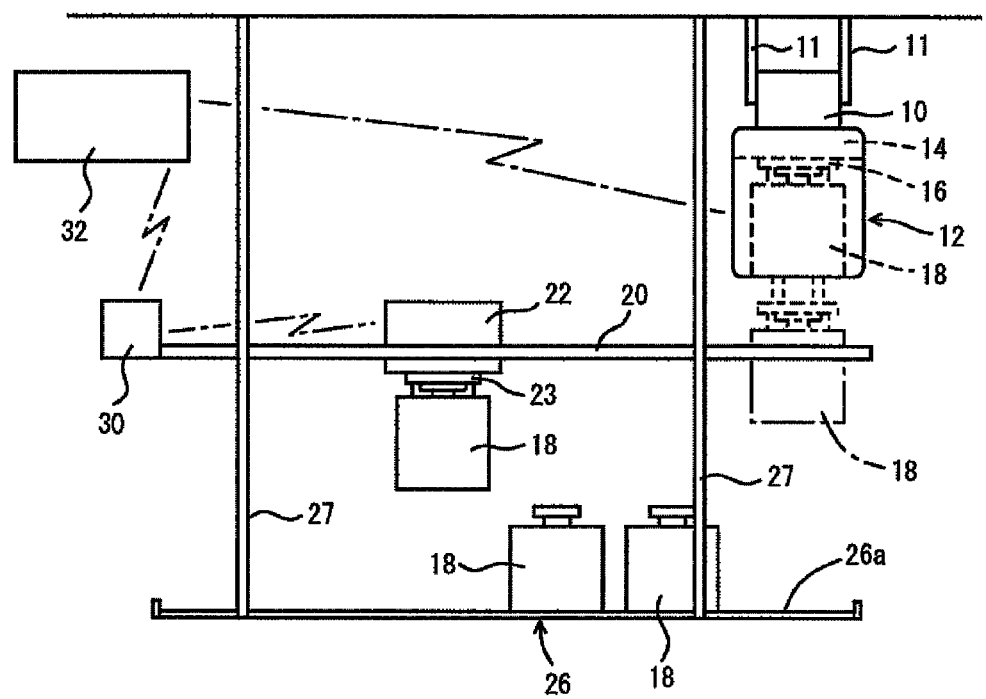

CONVEYING SYSTEM AND CONVEYING METHOD

CROSS REFERENCE TO RELATED APPLICATIONS

This application is a national stage of international application PCT/JP2011/074923, filed on Oct. 28, 2011, and claims the benefit of priority under 35 USC 119 of Japanese application 2010-247554, filed on Nov. 4, 2010, which are incorporated herein by reference.

BACKGROUND OF THE INVENTION

1. Field of the Invention

The present invention relates to a transfer system, and particularly relates to a transfer system that transports articles in and out of processing devices without causing the processing devices to wait.

2. Description of the Related Art

There is need for articles such as front opening unified pods (FOUPs: sealed cassettes for transporting semiconductor wafers) to be transported in and out of load ports of processing devices such as semiconductor processing devices and semiconductor inspection devices without causing the processing devices to wait. In view of this, it has been proposed to provide a buffer in the vicinity of processing devices, and provide additional transfer devices for performing transport between the buffers and the processing devices. For example, according to Patent Document 1 (JP 2006-224944A), a plurality of tracks for overhead travelling vehicles are arranged in parallel in a ceiling space, one of which is used for long-distance transport, and another of which is used for short-distance transport. Buffers are disposed under the track for long-distance transport, and load ports of processing devices are disposed under the track for short-distance transport. The overhead travelling vehicles for long-distance transport deliver and receive articles to and from the buffers, and the overhead travelling vehicles for short-distance transport deliver and receive articles between the buffers and the load ports. However, this formation makes the arrangement of a plurality of tracks in front of the processing device unavoidable.

According to Patent Document 2 (JP 2005150129A), buffers including a transfer device are provided in front of processing devices, overhead travelling vehicles deliver and receive articles to and from the buffers, and the transfer device in the buffer delivers and receives articles to and from the load port. However, a display for indicating the operation state, an operation panel for manual operation, and the like are provided on the front surface of the processing device, and it is not preferable for them to be blocked by the buffer. Furthermore, the load port is used not only by an automatic transfer device, but also for manual transport, and manual access is difficult if the front surface of the processing device is covered by the buffer.

CITATION LIST

Patent Document

Patent Document 1: JP 2006-224944A
Patent Document 2: JP 2005-150129A

SUMMARY OF THE INVENTION

It is an object of the present invention to temporarily store an article by effectively using an empty space between processing devices, without blocking front surfaces of the processing devices.

It is another object of the present invention to minimize the vertical strokes when delivering and receiving articles to and from the buffer.

The present invention is directed to a transfer system for transporting an article between a plurality of processing devices, having an overhead travelling vehicle track extending above load ports of the processing devices, and an overhead travelling vehicle configured to travel along the overhead travelling vehicle track and having a hoist, including:

a local track disposed lower than the overhead travelling vehicle track, extending at least to a position under the overhead travelling vehicle track, and oriented perpendicular to the overhead travelling vehicle track when viewed from above;

a local carriage configured to travel along the local track and having a hoist for vertically moving an article; and a buffer disposed below the local track, configured to deliver and receive an article to and from the local carriage, and extending at least to a position under the overhead travelling vehicle track.

According to the present invention, the local track and the buffer are arranged perpendicular to the overhead traveling vehicle track, and, thus, most portions of the local track and the buffer are arranged in the space between the processing devices, so that space is saved.

Moreover, according to the present invention, an article is transported between a plurality of processing devices by means of overhead travelling vehicles and a local carriage, using an overhead travelling vehicle track extending above load ports of the processing devices, a plurality of overhead travelling vehicles configured to travel along the overhead travelling vehicle track and having a hoist, a local track disposed lower than the overhead travelling vehicle track, extending at least to a position under the overhead travelling vehicle track, and oriented perpendicular to the overhead travelling vehicle track when viewed from above, a local carriage configured to travel along the local track and having a hoist for vertically moving an article, and a buffer disposed below the local track, configured to deliver and receive an article to and from the local carriage, and extending at least to a position under the overhead travelling vehicle track, wherein the steps for offloading a first article to a load port include:

a step for offloading the first article to a first position of the buffer under the overhead travelling vehicle track using a first overhead travelling vehicle;

a subsequent step for transporting the first article from the first position to a second position of the buffer using the local carriage;

a subsequent step for transporting the first article from the second position to the first position using the local carriage; and a subsequent step for picking up the first article from the first position and offloading the article to the load port using a second overhead travelling vehicle; and the steps for transporting out a second article from a load port include:

a step for picking up the second article from the load port and offloading the article to the first position using a third overhead travelling vehicle;

a subsequent step for transporting the second article from the first position to a second position of the buffer using the local carriage;

a subsequent step for transporting the second article from the second position to the first position using the local carriage; and a subsequent step for transporting out the second article from the first position using a fourth overhead travelling vehicle.

With this configuration, articles are delivered and received via the buffer between the load port and the overhead travelling vehicles, without blocking the front surfaces of the processing devices by the buffer.

Moreover, the present invention is directed to a transfer system configured to be added on to an existing transfer system so as to be lower than an overhead travelling vehicle track thereof and oriented perpendicular to the overhead travelling vehicle track when viewed from above, including:

a local track;

a local carriage configured to travel along the local track and having a hoist for vertically moving an article; and a buffer disposed below the local track and configured to deliver and receive an article to and from the local carriage;

wherein the local track and the buffer extend to positions under the overhead travelling vehicle track.

With this configuration, a system configured by a local track, a local carriage, and a buffer is added on to an existing transfer system. Furthermore, most portions of this system are arranged in the space between the processing devices, so that space is saved.

Preferably, the local track and the buffer each have one end disposed under the overhead travelling vehicle track and another end disposed in a space between the processing devices. With this configuration, one of two ends of the buffer protrudes from the space between the processing devices so as to be accessible for both the local carriage and the overhead travelling vehicle, and the other portions of the local track and the buffer are arranged in the space between the processing devices, so that space is saved.

Furthermore, preferably, a difference between heights of the buffer and the local track is determined so as to, when an article is placed on the buffer, allow the local carriage supporting another article to enter a position above the placed article. With this configuration, a long straight buffer may be provided in the space between the processing devices, and, thus, a large number of articles may be stored.

Preferably, a difference between heights of the buffer and the local track is determined so as to, when an article is placed on the buffer, prohibit the local carriage supporting another article from entering a position above the placed article, and allow the local carriage not supporting another article to enter said position. With this configuration, the difference between the heights of the local track and the buffer is minimized, and the amount of vertical movement of the article when the overhead travelling vehicle and the local carriage deliver and receive the article to and from the buffer is minimized, so that the article is delivered and received in a short time.

Preferably, the buffer is provided with two types of article placement positions with different heights, when an article is placed at a first type of placement position, the local carriage supporting another article is prohibited from entering a position above the placed article, but the local carriage not supporting an article is allowed to enter said position, when an article is placed at a second type of placement position, both the local carriage supporting another article and the local carriage not supporting another article are allowed to enter a position above the placed article, and the first type of placement position includes a position under the overhead travelling vehicle track. With this configuration, when the local carriage delivers and receives the article to and from the first type of placement position, the amount of vertical movement is small, and the overhead travelling vehicle also delivers and receives the article to and from the buffer with only a small amount of vertical movement. Furthermore, a large number of placement positions of the second type may be provided, and, thus, the number of storable articles may be increased. Preferably, the local track is configured by a lateral pair of rails, and a gap between the pair of rails is larger than a length of an article in a direction horizontal and perpendicular to a longitudinal direction of the rails. With this configuration, the article may pass through the gap between the pair of rails, so that the overhead travelling vehicle may deliver and receive the article to and from a position of the buffer under the local track.

BRIEF DESCRIPTION OF THE DRAWINGS

FIG. 2 is a side view of a main portion of the transfer system according to the embodiment.

DETAILED DESCRIPTION OF THE PREFERRED EMBODIMENTS

Figure 1:
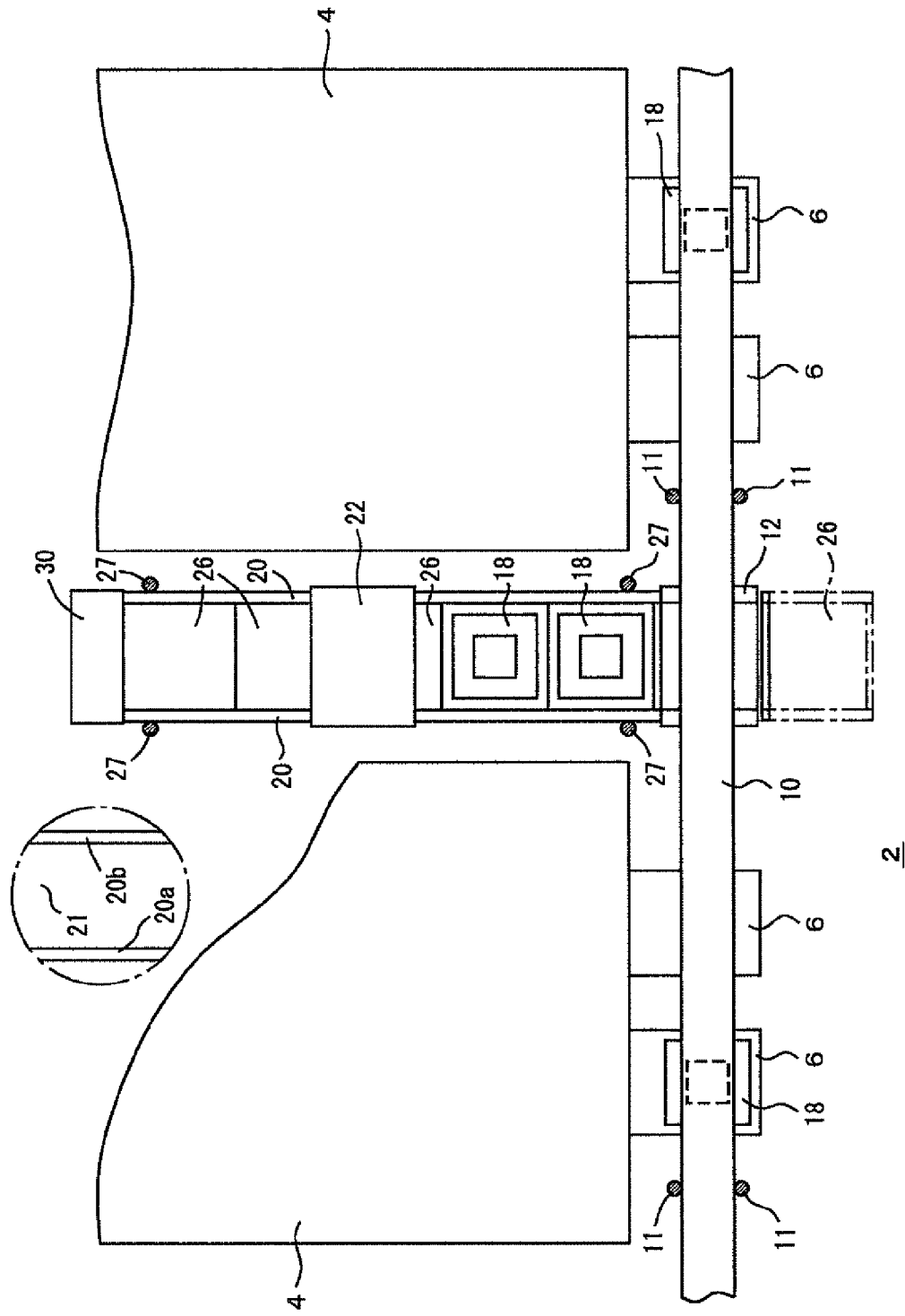
FIG. 1 is a plan view of a main portion of a transfer system according to an embodiment.

The following describes preferred embodiments of the present invention. The scope of the present invention is based on the claims, and is intended to be determined in accordance with the understanding of a person skilled in the art with reference to the description of the specification and techniques well known in this technical field.

FIGS. 1 to 8 show a transfer system according to an embodiment and variations thereof. In the drawings, reference numeral 2 denotes a transfer system, and reference numerals 4 denote processing devices such as a semiconductor processing device or a semiconductor inspection device. The transfer system 2 is provided inside a clean room. The processing devices 4 each have one or a plurality of load ports 6, and a track 10 for an overhead travelling vehicle 12 is provided above the load ports 6 by being supported from the ceiling by struts 11. As shown in FIG. 2, the overhead travelling vehicle 12 includes a hoist 14 that vertically moves an elevation platform 16 together with an article 18. The article 18 is, for example, a FOUP accommodating semiconductor wafers, but the type of article 18 may be freely decided. Furthermore, the overhead travelling vehicle 12 may include not only the hoist 14 but also other devices such as a device that laterally moves the hoist 14 and a device that rotates the hoist 14 about a vertical shaft. The track 10 and the overhead travelling vehicle 12 form a transfer system, and this system itself is known.

A local track 20 is provided between the processing devices 4, in a ceiling space above a passage where no load port 6 is provided. One of two ends of the local track 20 is under the track 10 for the overhead travelling vehicle 12, and the other end is in the space between the processing devices 4. Note that, as indicated by the dot-dashed line in FIG. 1, said one end may be extended over the track 10 for the overhead travelling vehicle 12. Furthermore, as shown in the dot-dashed line circle in FIG. 1, the local track is configured by a pair of rails 20a and 20b, and a gap 21 between the rails 20a and 20b has a width that is larger than a length of the article 18, so that the article 18 is allowed to pass through the gap 21 in a vertical direction. Note that the width of the gap 21 is determined with respect to a direction horizontal and perpendicular to a longitudinal direction of the rails 20a and 20b. Reference numeral 22 denotes a local carriage that reciprocally moves along the local track 20, and that has an elevation platform 23 shown in FIG. 2 capable of being vertically moved by a suspending member (not shown) such as a belt, a wire, or a rope. A buffer 26 is provided under the local track 20. In the buffer 26, a placement position 26a under the track 10 is a position accessible for both the overhead travelling vehicle 12 and the local carriage 22, that is, a position where both of them are allowed to deliver and receive articles, and other placement positions are accessible only for the local carriage 22. The local track 20, the local carriage 22, and the buffer 26 form a second transfer system, and this system may be added on to an existing transfer system. Reference numerals 27 denote struts that support the local track 20 and the buffer 26.

The local carriage 22 is driven, for example, by a battery that is charged by a charger 30 also functioning as a controller for the local carriage 22. As shown in FIG. 2, the charger 30 also functioning as the controller communicates with a controller 32 for the entire transfer system 2, and receives an instruction therefrom. Also, the overhead travelling vehicle 12 communicates with the controller 32, and receives an instruction therefrom. Furthermore, the local carriage 22 communicates with the charger 30, and receives an instruction therefrom. Note that the local carriage may not be provided with a battery, and may be supplied with power through non-contact electricity feeding or the like. A signal line and a feeder line for the charger 30 are arranged, for example, along the struts 27. Furthermore, the charger 30 is located so as to avoid a position where the overhead travelling vehicle 12 crosses the local track 20, that is, a position above the placement position 26a, so that charge of the local carriage 22 and access of the overhead travelling vehicle 12 to the buffer 26 do not interfere with each other. Regarding this aspect, the same is applicable to variations in FIGS. 5 and 6.

Figure 3:
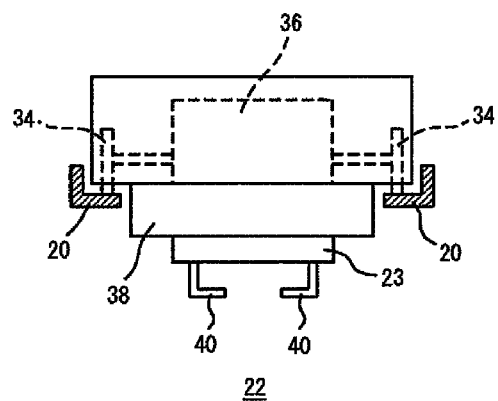
FIG. 3 is a front view showing the structure of a local carriage.

FIG. 3 shows the structure of the local carriage 22, including running wheels 34 that are driven by a running motor 36, and a battery (not shown) that is charged by the charger 30. Electricity may be supplied to the battery, for example, either through non-contact electricity feeding or contact electricity feeding using a connector, a charging coupler, or the like. Reference numeral 38 denotes a hoist that vertically moves the elevation platform 23, and reference numerals 40 denote chucks that grab and release a flange at the top of the article 18.

Figure 4:
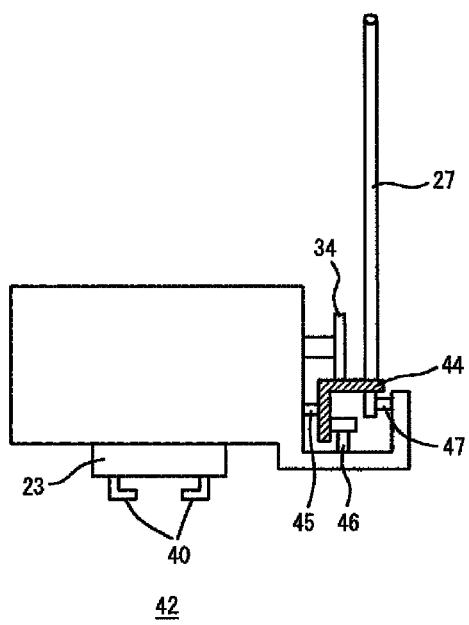
FIG. 4 is a front view of the local carriage according to a variation.

In this example, the local track 20 is configured by two rails 20a and 20b, but there is no limitation to this. Another example is shown in FIG. 4, where the same constituent components as those in the foregoing embodiment are denoted by the same reference numerals. Reference numeral 44 denotes a new local track that is disposed below the track 10 while not being directly under the track 10, and reference numeral 42 denotes a new local carriage. The local carriage 42 is supported by the local track 44 via guide rollers 45 to 47 and travels along the local track 44, and aspects other than the above are similar to those in the foregoing embodiment shown in FIGS. 1 to 3.

Figure 5:
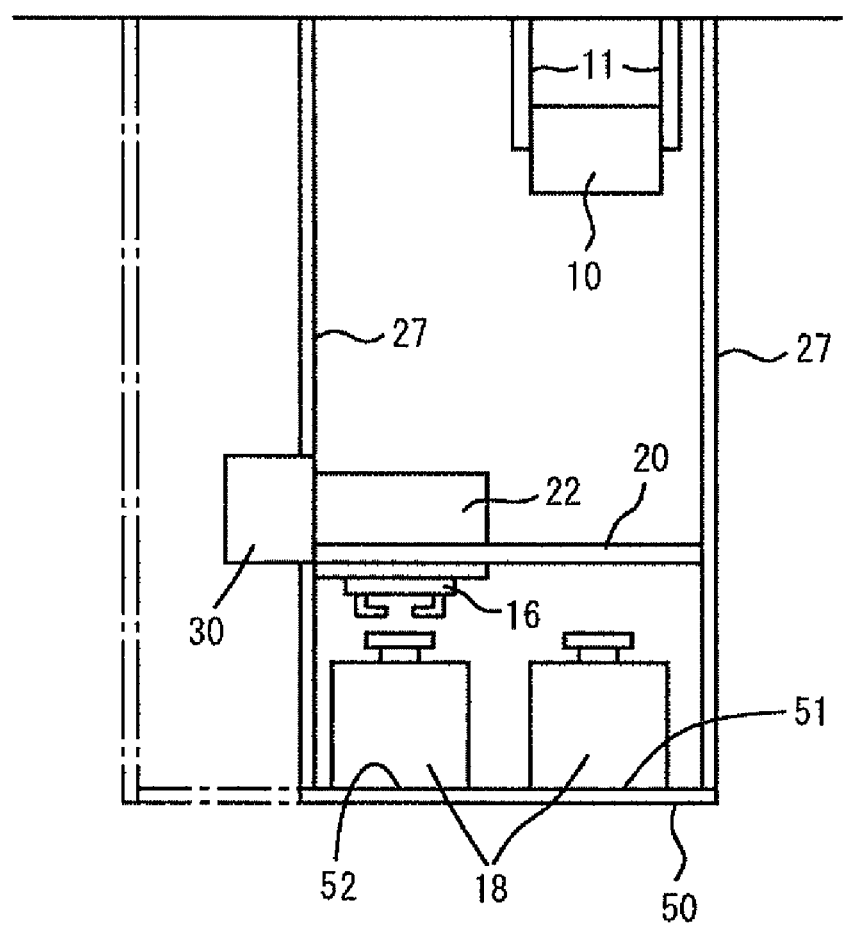
FIG. 5 is a side view of a main portion of the transfer system according to a variation.
Figure 6:
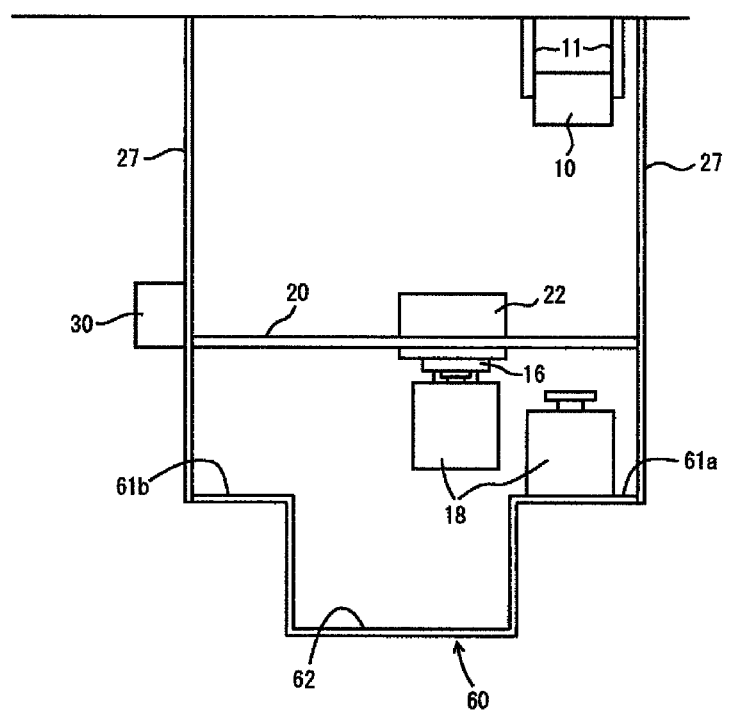
FIG. 6 is a side view of a main portion of the transfer system according to a second variation.

FIGS. 5 and 6 show variations of the arrangement of the buffer, where reference numeral 50 denotes a new buffer. In the buffer 50, a difference between heights of article placement positions 51 and 52 and the local carriage 22 corresponds to a height of more than one article and less than two articles. The buffer 50 delivers and receives the article 18 to and from the overhead travelling vehicle 12 at the placement position 51, and can store, for example, one more article 18 at the placement position 52. Note that, as indicated by the dot-dashed line in FIG. 5, the configuration is also possible for allowing three or more articles 18 to be placed. According to the variation in FIG. 5, an amount of vertical movement of the article 18 when delivering and receiving the article 18 to and from the buffer 50 is minimized, and the article 18 is delivered and received at high speed. However, in the variation in FIG. 5, if the articles 18 are placed at both of the placement positions 51 and 52, it is not possible for the articles 18 to be switched. Furthermore, the order for transporting out the articles 18 is set, that is, the article 18 at the placement position 51 is transported out first, after which the article 18 at the placement position 52 is transported out.

According to the variation in FIG. 6, a buffer 60 includes placement positions 61a, 61b, and 62 having two different heights. Here, a difference between heights of placement faces of the placement positions 61a and 61b and the local carriage 22 corresponds to a height of more than one article and less than two articles, and a difference between heights of a placement face of the placement position 62 and the local carriage 22 corresponds to a height of more than two articles. Accordingly, when the articles 18 are placed at the placement positions 61a, 61b, and 62, the local carriage 22 supporting the article 18 is allowed to pass through a position above the placement position 62, but is not allowed to enter positions above the placement positions 61a and 61b. For example, the placement positions 61a and 61b may each accommodate one article 18, and the placement position 62 may accommodate two articles 18, but the configuration is also possible in which the placement position 62 may accommodate only one article 18 or three or more articles 18. According to the variation in FIG. 6, the amount of vertical movement when delivering and receiving the article 18 to and from the placement positions 61a and 61b is minimized, and the number of storable articles 18 is increased by additionally providing the placement positions 62.

Figure 7:
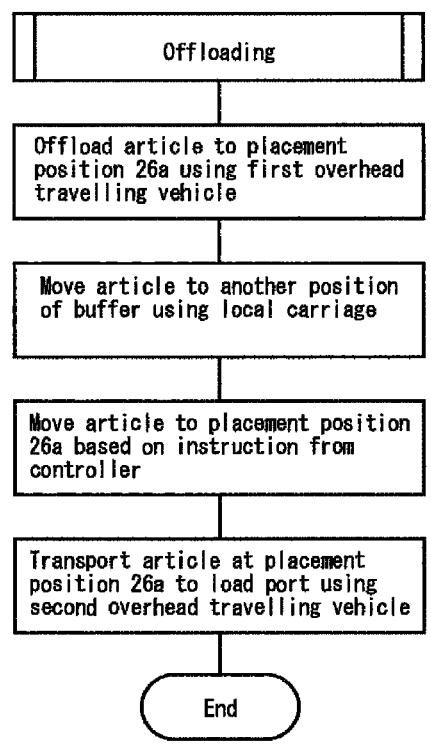
FIG. 7 is a flowchart showing an offload algorithm from an overhead travelling vehicle to a load port according to the embodiment.
Figure 8:
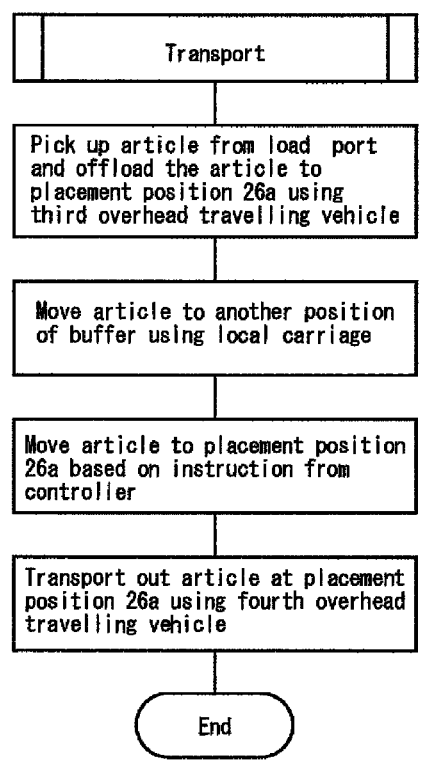
FIG. 8 is flowchart showing a pickup algorithm from the load port to the overhead travelling vehicle according to the embodiment.

FIGS. 7 and 8 show the operations according to the embodiment (FIGS. 1 to 3) and its variations (FIGS. 4 to 6). In the offloading to a load port, a first overhead travelling vehicle 12 transports in advance a first article 18, which is required to be delivered to the load port 6, for example, to the placement position 26a of the buffer 26. The local carriage 22 transports the first article 18, for example, from the placement position 26a to another placement position such as the buffer 26, 50, or 60. Before the desirable time for the article 18 to be delivered to the load port 6, the local carriage 22 returns the article 18, for example, to the placement position 26a that is accessible for the overhead travelling vehicle 12 based on an instruction from the controller 32. Next, for example, a second overhead travelling vehicle 12 picks up the article 18 and transfers it to the load port 6.

In the transport of the article 18 that has been transported out of a processing device 4 from the load port 6, as shown in FIG. 8, a third overhead travelling vehicle 12 transports the article, for example, to the placement position 26a of the buffer 26. The local carriage 22 transports the article 18, for example, from the placement position 26a to another placement position such as the buffer 26, 50, or 60. Before the arrival of a fourth overhead travelling vehicle 12 that will transport the article 18 from the buffer 26, 50, or 60 to a next processing device 4, the local carriage 22 returns the article 18, for example, to the placement position 26a that is accessible for the overhead travelling vehicle 12 based on an instruction from the controller 32. Next, the fourth overhead travelling vehicle 12 picks up the article 18 and transports it to the next processing device 4.

The embodiment and its variations achieve the following advantageous effects.

1) The buffers 26, 50, and 60 may be arranged in a space between the processing devices 4, and the entire transfer system 2 may be disposed in an overhead space, so that space is saved.

2) Both the overhead travelling vehicle 12 and the local carriage 22 may access the placement position 26a and the like through the gap 21 between the travelling rails 20a and 20b of the local track 20.

3) The buffers 26, 50, and 60 have a simple straight structure, and it is sufficient for the local carriage 22 to be a simple carriage that reciprocally moves along the short local track 20.

4) In the case of the buffer 26, a large number of articles 18 may be stored.

5) In the case of the buffer 50, the amount of vertical movement of the article 18 is minimized, so that the transfer is performed in a short time.

6) In the case of the buffer 60, the number of storable articles 18 may be increased, and, furthermore, the amount of vertical movement of the article 18 may be reduced.

7) In the case of the buffers 50 and 60, the overhead travelling vehicle 12 and the local carriage 22 may transfer the article 18 to the placement positions 51, 61a, and 61b with only a small amount of vertical movement.

LIST OF REFERENCE NUMERALS

2 Transfer system
4 Processing device
6 Load port
10 Track
11 Strut
12 Overhead travelling vehicle
14 Hoist
16 Elevation platform
18 Article
20 Local track
20a, 20b Rail
21 Gap
22 Local carriage
23 Elevation platform
26 Buffer
26a Placement position
27 Strut
30 Charger
32 Controller
34 Running wheel
36 Running motor
38 Hoist
40 Chuck
42 Local carriage
44 Local track
45-47 Guide roller
50, 60 Buffer
51, 52 Placement position
61a, 61b, 62 Placement position

What is claimed is:

1. A transfer system for transporting articles between a plurality of processing devices comprising:
   an overhead travelling vehicle track extending above load ports of the processing devices;
   an overhead travelling vehicle configured to travel along the overhead travelling vehicle track and having a hoist:
   a local track disposed lower than the overhead travelling vehicle track, extending at least to a position under the overhead travelling vehicle track, and oriented perpendicular to the overhead travelling vehicle track when viewed from above;
   a local carriage configured to travel along the local track and having a hoist for vertically moving an article; and
   a buffer disposed below the local track, configured to allow the local carriage to deliver and receive an article to and from the buffer, and extending at least to a position under the overhead travelling vehicle track, wherein
   the local track is configured by a lateral pair of rails, and
   a gap between the pair of rails is larger than a length of an article in a direction horizontal and Perpendicular to a longitudinal direction of the rails.

2. The transfer system according to claim 1, wherein the local track and the buffer each have one end disposed under the overhead travelling vehicle track and another end disposed in a space between the processing devices.

3. The transfer system according to claim 1, wherein a difference between heights of the buffer and the local track is determined so as to, when an article is placed on the buffer, allow the local carriage supporting another article to enter a position above the placed article.

4. The transfer system according to claim 1, wherein a difference between heights of the buffer and the local track is determined so as to, when an article is placed on the buffer, prohibit the local carriage supporting another article from entering a position above the placed article, and allow the local carriage not supporting another article to enter said position.

5. The transfer system according to claim 1, wherein
   the buffer is provided with two types of article placement positions with different heights,
   when an article is placed at a first type of placement position, the local carriage supporting another article is prohibited from entering a position above the placed article, but the local carriage not supporting an article is allowed to enter said position,
   when an article is placed at a second type of placement position, both the local carriage supporting another article and the local carriage not supporting another article are allowed to enter a position above the placed article, and
   the first type of placement position includes a position under the overhead travelling vehicle track.

6. A transfer system configured to be added on to an existing transfer system to a height lower than an overhead travelling vehicle track thereof and oriented perpendicular to the overhead travelling vehicle track when viewed from above, comprising:
   a local track;
   a local carriage configured to travel along the local track and having a hoist for vertically moving an article; and
   a buffer disposed below the local track and configured to allow the local carriage to deliver and receive an article to and from the buffer; wherein the local track and the buffer extend to positions under the overhead travelling vehicle track, and the hoist of the local carriage is mounted on an underside of the local carriage and vertically moves an elevation platform having chucks mounted thereto to grab and release an article located underneath the local carriage.

7. A method for transporting an article between a plurality of processing devices by means of overhead travelling vehicles and a local carriage, using:

an overhead travelling vehicle track extending above load ports of the processing devices, a plurality of overhead travelling vehicles configured to travel along the overhead travelling vehicle track and having a hoist, a local track disposed lower than the overhead travelling vehicle track, extending at least to a position under the overhead travelling vehicle track, and oriented perpendicular to the overhead travelling vehicle track when viewed from above, a local carriage configured to travel along the local track and having a hoist for vertically moving an article, and a buffer disposed below the local track, configured to allow the local carriage to deliver and receive an article to and from the buffer, and extending at least to a position under the overhead travelling vehicle track, wherein the hoist of the local carriage is mounted on an underside of the local carriage and vertically moves an elevation platform having chucks mounted to grab and release an article located underneath the local carriage, and the method comprising, for transporting an article from a first load port to a second load port:

a step for picking up the article from the first load port by a first overhead travelling vehicle and offloading the article to a first position of the buffer under the overhead travelling vehicle track by the first overhead travelling vehicle, a subsequent step for transporting the article from the first position to a second position of the buffer by the local carriage, a subsequent step for transporting the article from the second position to the first position by the local carriage, and a subsequent step for transporting out the article from the first position and offloading the article to the second load port by a second overhead travelling vehicle.

8. A transfer system for transporting articles between a plurality of processing devices comprising:

an overhead travelling vehicle track extending above load ports of the processing devices;

an overhead travelling vehicle configured to travel along the overhead travelling vehicle track and having a hoist:

a local track disposed lower than the overhead travelling vehicle track, extending at least to a position under the overhead travelling vehicle track, and oriented perpendicular to the overhead travelling vehicle track when viewed from above;

a local carriage configured to travel along the local track and having a hoist for vertically moving an article; and a buffer disposed below the local track, configured to allow the local carriage to deliver and receive an article to and from the buffer, and extending at least to a position under the overhead travelling vehicle track, wherein the hoist of the local carriage is mounted on an underside of the local carriage and vertically moves an elevation platform having chucks mounted thereto to grab and release an article located underneath the local carriage.

9. The transfer system according to claim 8, wherein the buffer is disposed below the local track at a position such that both the local carriage and the overhead travelling vehicle can use their vertically moveable hoists and chucks to grab and release articles that are in the buffer.

10. The transfer system according to claim 6, wherein the buffer is disposed below the local track at a position such that both the local carriage and the overhead travelling vehicle can use their vertically moveable hoists and chucks to grab and release articles that are in the buffer.

11. The method for transporting an article according to claim 7, wherein the buffer is disposed below the local track at a position such that both the local carriage and the overhead travelling vehicle can use their vertically moveable hoists and chucks to grab and release articles that are in the buffer.

* * * * *